United States Patent
Lee et al.

(10) Patent No.: US 10,811,262 B2
(45) Date of Patent: Oct. 20, 2020

(54) SEMICONDUCTOR DEVICE HAVING A UNIFORM AND THIN SILICIDE LAYER ON AN EPITAXIAL SOURCE/ DRAIN STRUCTURE AND MANUFACTURING METHOD THEREOF

(71) Applicant: TAIWAN SEMICONDUCTOR MANUFACTURING CO., LTD., Hsinchu (TW)

(72) Inventors: Kai-Hsuan Lee, Hsinchu (TW); Jyh-Cherng Sheu, Hsinchu (TW); Sung-Li Wang, Zhubei (TW); Cheng-Yu Yang, Changhua County (TW); Sheng-Chen Wang, Hsinchu (TW); Sai-Hooi Yeong, Zhubei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/996,031

(22) Filed: Jan. 14, 2016

(65) Prior Publication Data
US 2017/0207095 A1 Jul. 20, 2017

(51) Int. Cl.
*H01L 21/768* (2006.01)
*H01L 21/285* (2006.01)
*H01L 29/66* (2006.01)
*H01L 29/06* (2006.01)
*H01L 29/08* (2006.01)
*H01L 29/417* (2006.01)
*H01L 23/485* (2006.01)

(52) U.S. Cl.
CPC .. *H01L 21/28518* (2013.01); *H01L 21/76889* (2013.01); *H01L 29/0653* (2013.01); *H01L 29/0847* (2013.01); *H01L 29/41791* (2013.01); *H01L 29/66545* (2013.01); *H01L 29/66795* (2013.01); *H01L 21/76843* (2013.01); *H01L 21/76855* (2013.01); *H01L 23/485* (2013.01)

(58) Field of Classification Search
CPC .................................. H01L 21/76889
USPC ........................................... 438/682
See application file for complete search history.

(56) References Cited

U.S. PATENT DOCUMENTS

| | | | |
|---|---|---|---|
| 6,486,062 B1 * | 11/2002 | Kluth | H01L 21/28518 257/E21.165 |
| 7,667,271 B2 | 2/2010 | Yu et al. | |
| 7,910,453 B2 | 3/2011 | Xu et al. | |
| 8,377,779 B1 | 2/2013 | Wang | |
| 8,399,931 B2 | 3/2013 | Liaw et al. | |
| 8,652,894 B2 | 2/2014 | Lin et al. | |
| 8,686,516 B2 | 4/2014 | Chen et al. | |
| 8,716,765 B2 | 5/2014 | Wu et al. | |
| 8,723,272 B2 | 5/2014 | Liu et al. | |
| 8,729,627 B2 | 5/2014 | Cheng et al. | |
| 8,735,993 B2 | 5/2014 | Lo et al. | |
| 8,736,056 B2 | 5/2014 | Lee et al. | |

(Continued)

*Primary Examiner* — Hsin Yi Hsieh
(74) *Attorney, Agent, or Firm* — McDermott Will & Emery LLP

(57) ABSTRACT

In a method of manufacturing a semiconductor device, a first layer containing an amorphous first material is formed by a deposition process over a semiconductor layer. A second layer containing a metal second material is formed over the first layer. A thermal process is performed to form an alloy layer of the amorphous first material and the metal second material.

18 Claims, 15 Drawing Sheets

(56) References Cited

U.S. PATENT DOCUMENTS

| | | |
|---|---|---|
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 2006/0040438 A1* | 2/2006 | Lu ........................ H01L 21/265 |
| | | 438/197 |
| 2006/0079087 A1* | 4/2006 | Kawamura ....... H01L 21/28052 |
| | | 438/664 |
| 2008/0048276 A1* | 2/2008 | Jeon .................. H01L 21/28052 |
| | | 257/412 |
| 2014/0001574 A1 | 1/2014 | Chen et al. |
| 2014/0110755 A1 | 4/2014 | Colinge |
| 2014/0151812 A1 | 6/2014 | Liaw |
| 2015/0061034 A1* | 3/2015 | Riley ..................... H01L 29/47 |
| | | 257/377 |
| 2015/0162415 A1* | 6/2015 | Yin ....................... H01L 29/665 |
| | | 257/347 |
| 2016/0049397 A1* | 2/2016 | Chang .................. H01L 27/092 |
| | | 257/329 |
| 2016/0211338 A1* | 7/2016 | Wang .............. H01L 21/823481 |

\* cited by examiner

US 10,811,262 B2

SEMICONDUCTOR DEVICE HAVING A UNIFORM AND THIN SILICIDE LAYER ON AN EPITAXIAL SOURCE/DRAIN STRUCTURE AND MANUFACTURING METHOD THEREOF

TECHNICAL FIELD

The disclosure relates to a semiconductor integrated circuit, and more particularly to a semiconductor device having a uniform and thin silicide layer on an epitaxial source/drain (S/D) structure and its manufacturing process.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (Fin FET) and the use of a metal gate structure with a high-k (dielectric constant) material. The metal gate structure is often manufactured by using gate replacement technologies, and sources and drains are formed by using an epitaxial growth method. Further, a silicide layer is formed on the sources and drains.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanied drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in/between the described operations, and the order of operations may be changed.

FIGS. 1A-1D show exemplary sequential process flow for forming a silicide layer according to one embodiment of the present disclosure.

Figure 1A:
FIGS. 1A-1D show an exemplary sequential process flow according to one embodiment of the present disclosure.

As shown in FIG. 1A, a first layer 2 containing an amorphous first material is formed by a deposition process over a semiconductor layer 1. The semiconductor layer 1 includes Si, SiGe, SiP, SiC, SiCP or any other suitable semiconductor material. The semiconductor layer 1 is generally a crystalline layer. The amorphous material for the first layer 2 includes amorphous silicon or amorphous germanium. In one embodiment, amorphous Si (a-Si) is formed over the semiconductor layer 1. The thickness of the first layer 2 is in a range from about 1 nm to about 10 nm in some embodiments, and is in a range from about 3 nm to about 5 nm in other embodiments.

The first layer is formed by, for example, chemical vapor deposition (CVD), physical vapor deposition (PVD), atomic layer deposition (ALD) or other suitable film formation methods.

The amorphous first layer 2 is doped with, for example, boron for a p-type semiconductor or phosphorous for an n-type semiconductor layer. The concentration of the dopant is in a range from $1 \times 10^{20}$ cm$^{-3}$ to $1 \times 10^{22}$ cm$^{-3}$ in some embodiments. Instead of an amorphous material, a polycrystalline material, such as polysilicon or a microcrystalline material may be used as the first layer 2.

Figure 1B:
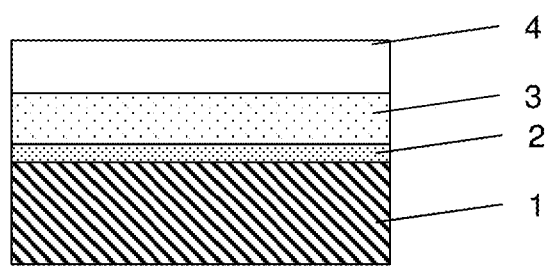
Figure 1C:
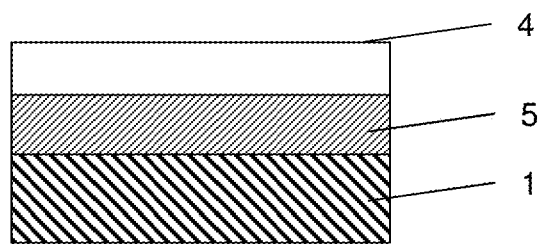

Then, as shown in FIG. 1B, a second layer 3 containing a metal second material is formed over the first layer 2, and a third layer 4 containing a third material is formed over the second layer 3. The metal material for the second layer 3 is at least one of Ti, Co, Ni, W or Ta. In one embodiment, Ti is used for the second layer 3. Two or more layers of metal material may be used for the second layer 3. The thickness of the second layer 3 is in a range from about 1 nm to about 15 nm in some embodiments, and is in a range from about 3 nm to about 10 nm in other embodiments.

In some embodiments, a cleaning operation is performed on the first layer 2 before forming the second layer 3. The cleaning operation includes wet cleaning using dilute HF (DHF) and/or buffered HF (BHF). An in-situ cleaning using a gas or plasma (NF$_3$ and/or NH$_3$) in a chamber for forming the second layer may be employed as the cleaning operation.

The third material for the third layer 4 includes a metal nitride, such as TiN or TaN. In one embodiment, TiN is used for the third layer 4. The thickness of the third layer 4 is in a range from about 1 nm to about 5 nm in some embodiments, and is in a range from about 1 nm to about 3 nm in other embodiments. The third layer is optional.

The second and third layers are formed by, for example, chemical vapor deposition (CVD), physical vapor deposition (PVD) including sputtering, atomic layer deposition (ALD) or other suitable film formation methods. In some embodiments, the second and third layers are continuously formed in the same chamber by introducing a reactive gas containing nitrogen.

After the second and third layers are formed, a thermal process, i.e., annealing, is performed to form an alloy layer of the amorphous first material and the metal second material. When the amorphous material is Si, a silicide layer is formed, and when the amorphous material is Ge, a germanide layer is formed. In one embodiment, a TiSi layer 5 is formed by the annealing operation.

The annealing operation is performed at a temperature from about 500° C. to about 1000° C. in some embodiments. In other embodiments, the annealing temperature is in a range from about 800° C. to about 1000° C. The annealing operation is performed for a time period from about 1 μsec to about 1 msec. In other embodiments, the annealing period is the millisecond range, for example, in a range from about 1 msec to about 100 msec. The annealing operation is performed in an inert gas ambient.

The thickness of the silicide (alloy) layer 5 is in a range from about 1 nm to about 10 nm in some embodiments, and is in a range from about 3 nm to about 5 nm in other embodiments.

By the annealing operation, the first amorphous material (e.g., a-Si) of the first layer 2 is substantially completely consumed to form the alloy layer 5. In order for the first amorphous material to be completely consumed, the thickness of the first layer 2 and the annealing condition are adjusted. For example, the thicker the first layer 2 is, the longer the annealing time period is and/or the higher the annealing temperature is.

After the silicide (alloy) layer 5 is formed, the third layer 4 is selectively removed by using a wet and/or a dry etching process.

In some embodiments, the second layer 3 (e.g., Ti) is substantially completely consumed so as to form the silicide layer 5. However, in other embodiment, the second layer 3 (e.g., Ti) is not completely consumed and remains over the silicide layer 5. In such a case, the remaining second layer 3 is also removed when the third layer 4 is removed.

Figure 1D:
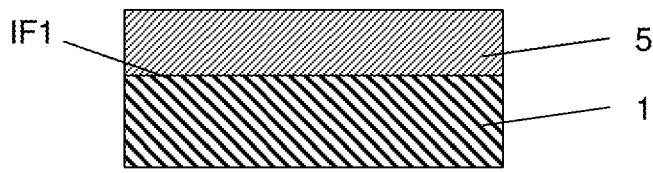
Figure 1E:
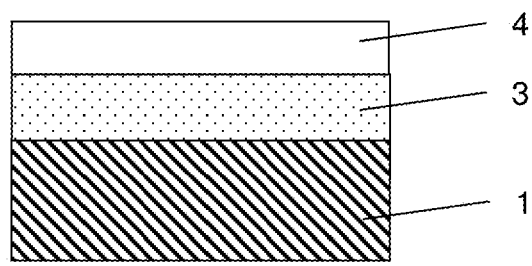
FIGS. 1E-1G show an exemplary sequential process flow according to a comparative example of the present disclosure.
Figure 1F:
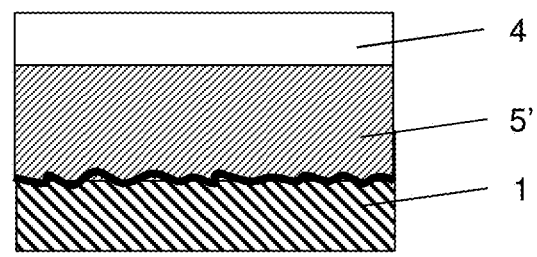
Figure 1G:
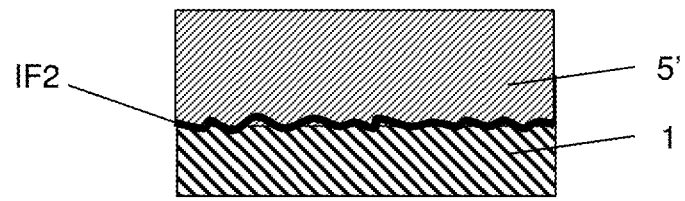

FIGS. 1E-1G show exemplary sequential process flow according to a comparative example of the present disclosure.

In the comparative example, the amorphous layer 1 is not formed over the semiconductor layer (e.g., Si), and the second metal material layer (e.g., a Ti layer) is directly formed over the semiconductor layer 1 as shown in FIG. 1E. In FIG. 1E, the third layer 4 (e.g., TiN) is also formed.

By the annealing operation, the silicide layer 5' is formed, as shown in FIG. 1F. Further, the third layer 4 is removed, as shown in FIG. 1G.

In the comparative example, the interface IF2 between the semiconductor layer 1 and the silicide layer 5' becomes rough and the thickness of the silicide layer 5' varies. The thickness variation may be the average thickness±1-3 nm.

In contrast, in FIG. 1D, the amorphous layer 1 is formed into silicide faster than a crystalline semiconductor. By adjusting the annealing conditions, the silicide layer thickness can be substantially determined by the amorphous layer. Accordingly, the interface IF1 between the semiconductor layer 1 and the silicide layer 5 has a smoother interface, and the silicide layer 5 has a substantially uniform thickness with the thickness variation of the thickness being ±1 nm from the average thickness in some embodiments. In other embodiments, the thickness variation is ±1.0 nm.

FIGS. 2-16 show exemplary cross sectional views of various stages for manufacturing a Fin FET device according to one embodiment of the present disclosure. It is understood that additional operations can be provided before, during, and after the processes shown by FIGS. 2-16, and some of the operations described below can be replaced or eliminated, for additional embodiments of the method. The order of the operations/processes may be interchangeable. Further, the configurations, structures, operations and/or materials used for FIGS. 1A-1D may be applied to the manufacturing processes shown by FIGS. 2-16, and the detailed description may be omitted.

To fabricate fin structures for the Fin FET device, a mask layer 15 is formed over a substrate 10. The mask layer 15 is formed by, for example, a thermal oxidation process and/or a chemical vapor deposition (CVD) process. The substrate 10 is, for example, a p-type silicon or germanium substrate with an impurity concentration in a range from about $1 \times 10^{15}$ $cm^{-3}$ to about $1 \times 10^{16}$ $cm^{-3}$. In other embodiments, the substrate is an n-type silicon or germanium substrate with an impurity concentration in a range from about $1 \times 10^{15}$ $cm^{-3}$ to about $1 \times 10^{16}$ $cm^{-3}$.

Alternatively, the substrate 10 may comprise another elementary semiconductor, such as germanium; a compound semiconductor including Group IV-IV compound semiconductors such as SiC and SiGe, Group III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate 10 is a silicon layer of an SOI (silicon-on insulator) substrate. When an SOI substrate is used, the fin structure may protrude from the silicon layer of the SOI substrate or may protrude from the insulator layer of the SOI substrate. In the latter case, the silicon layer of the SOI substrate is used to form the fin structure. Amorphous substrates, such as amorphous Si or amorphous SiC, or insulating material, such as silicon oxide may also be used as the substrate 10. The substrate 10 may include various regions that have been suitably doped with impurities (e.g., p-type or n-type conductivity).

The mask layer 15 includes, for example, a pad oxide (e.g., silicon oxide) layer 15A and a silicon nitride mask layer 15B in some embodiments.

The pad oxide layer 15A may be formed by using thermal oxidation or a CVD process. The silicon nitride mask layer 15B may be formed by a physical vapor deposition (PVD), such as a sputtering method, a CVD, plasma-enhanced chemical vapor deposition (PECVD), an atmospheric pressure chemical vapor deposition (APCVD), a low-pressure CVD (LPCVD), a high density plasma CVD (HDPCVD), an atomic layer deposition (ALD), and/or other processes.

The thickness of the pad oxide layer 15A is in a range from about 2 nm to about 15 nm and the thickness of the silicon nitride mask layer 15B is in a range from about 2 nm to about 50 nm in some embodiments. A mask pattern is further formed over the mask layer. The mask pattern is, for example, a resist pattern formed by lithography operations.

Figure 2:
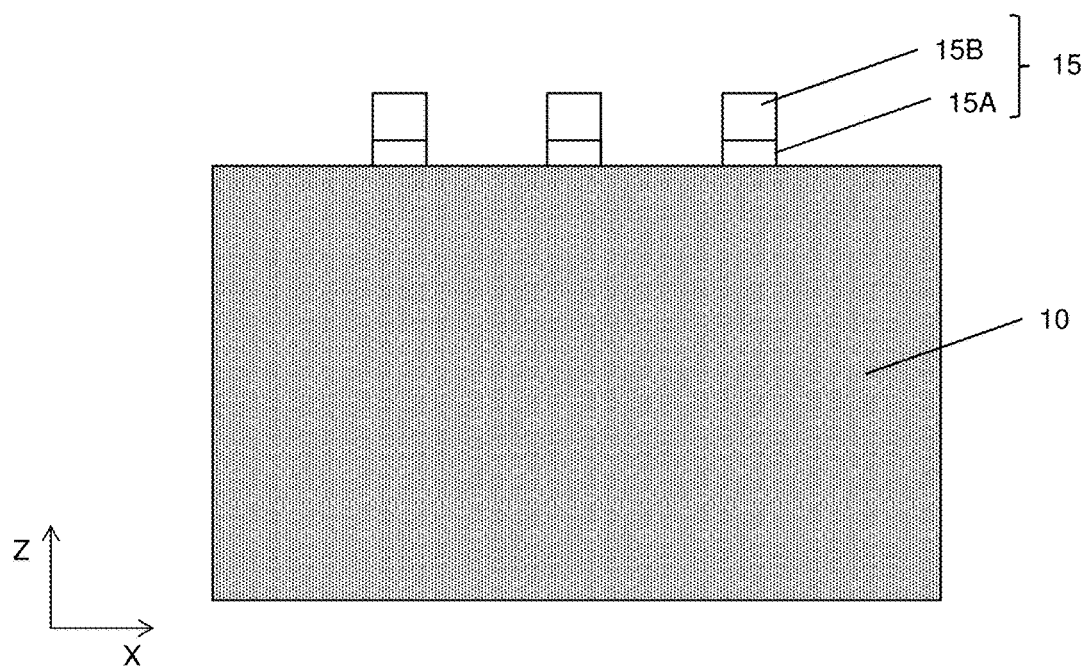
FIGS. 2-16 show exemplary cross sectional views of various stages for manufacturing a Fin FET device according to one embodiment of the present disclosure.

By using the mask pattern as an etching mask, a hard mask pattern 15 of the pad oxide layer and the silicon nitride mask layer is formed, as shown in FIG. 2.

Figure 3:
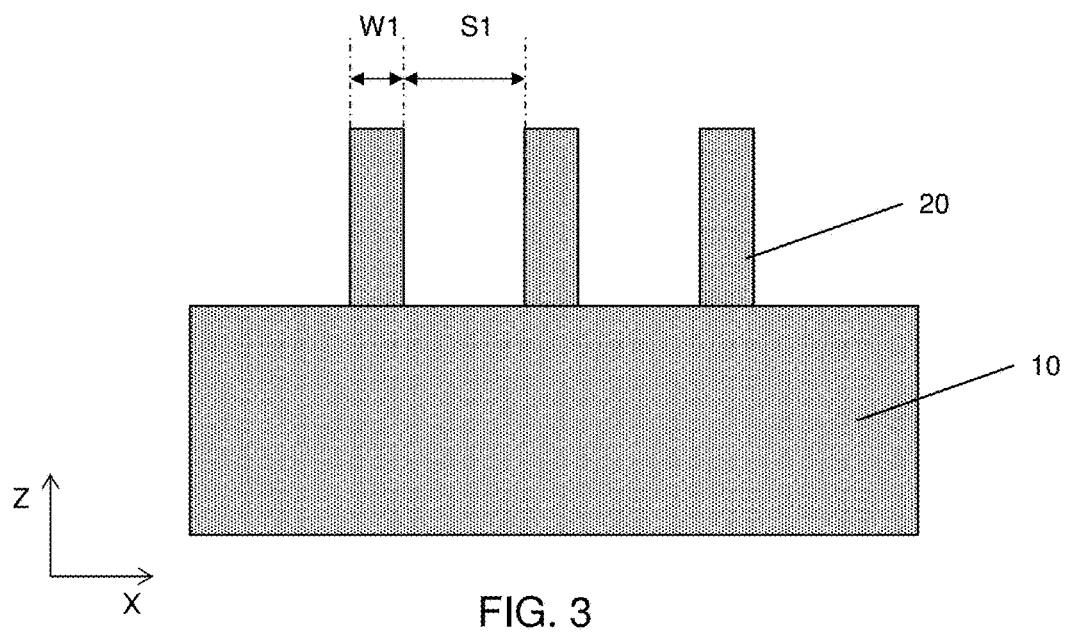

Then, as shown in FIG. 3, by using the hard mask pattern 15 as an etching mask, the substrate 10 is patterned into fin structures 20 by trench etching using a dry etching method and/or a wet etching method.

In FIG. 3, three fin structures 20 are disposed over the substrate 10. However, the number of the fin structures is not limited to three. The numbers may be as small as one or more than three. In addition, one or more dummy fin structures may be disposed adjacent both sides of the fin structure 20 to improve pattern fidelity in patterning processes.

The fin structure 20 may be made of the same material as the substrate 10 and may continuously extend from the substrate 10. In this embodiment, the fin structure is made of Si. The silicon layer of the fin structure 20 may be intrinsic, or appropriately doped with an n-type impurity or a p-type impurity.

The width W1 of the fin structure 20 is in a range from about 5 nm to about 40 nm in some embodiments, and is in a range from about 7 nm to about 12 nm in other embodiments. The space S1 between two fin structures is in a range from about 10 nm to about 50 nm in some embodiments. The height (along the Z direction) of the fin structure 20 is in a range from about 100 nm to about 300 nm in some embodiments, and is in a range from about 50 nm to 100 nm in other embodiments.

The lower part of the fin structure 20 under the gate structure 40 (see, FIGS. 6B and 7A) may be referred to as a well region, and the upper part of the fin structure 20 may be referred to as a channel region. Under the gate structure 40, the well region is embedded in the isolation insulating layer 30 (see, FIG. FIGS. 6B and 7A), and the channel region protrudes from the isolation insulating layer 30. A lower part of the channel region may also be embedded in the isolation insulating layer 30 to a depth of about 1 nm to about 5 nm.

The height of the well region is in a range from about 60 nm to 100 nm in some embodiments, and the height of the channel region is in a range from about 40 nm to 60 nm, and is in a range from about 38 nm to about 55 nm in other embodiments.

Figure 4:
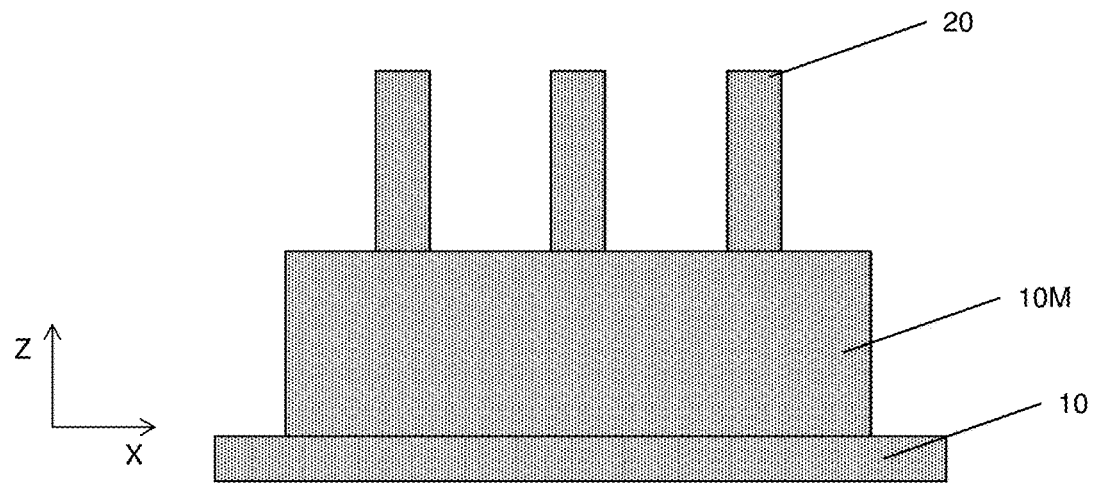

In some embodiments, after the fin structures 20 are formed, the substrate 10 is further etched to form a mesa shape 10M, as shown in FIG. 4. In other embodiments, the mesa shape 10M is first formed, and then the fin structures 20 are formed. The mesa shape is not formed in certain other embodiments.

After the fin structures 20 and the mesa shape 10M are formed, the isolation insulating layer 30 is formed in spaces between the fin structures and/or a space between one fin structure and another element formed over the substrate 10. The isolation insulating layer 30 may also be called a "shallow-trench-isolation (STI)" layer. The insulating material for the isolation insulating layer 30 may include one or more layers of silicon oxide, silicon nitride, silicon oxynitride (SiON), SiOCN, fluorine-doped silicate glass (FSG), or a low-k dielectric material. The isolation insulating layer is formed by LPCVD (low pressure chemical vapor deposition), plasma-CVD or flowable CVD. In the flowable CVD, flowable dielectric materials instead of silicon oxide may be deposited. Flowable dielectric materials, as their name suggest, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydro-polysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove undesired element(s) to form silicon oxide. When the undesired element(s) is removed, the flowable film densifies and shrinks. In some embodiments, multiple anneal processes are conducted. The flowable film is cured and annealed more than once. The flowable film may be doped with boron and/or phosphorous.

Figure 5:
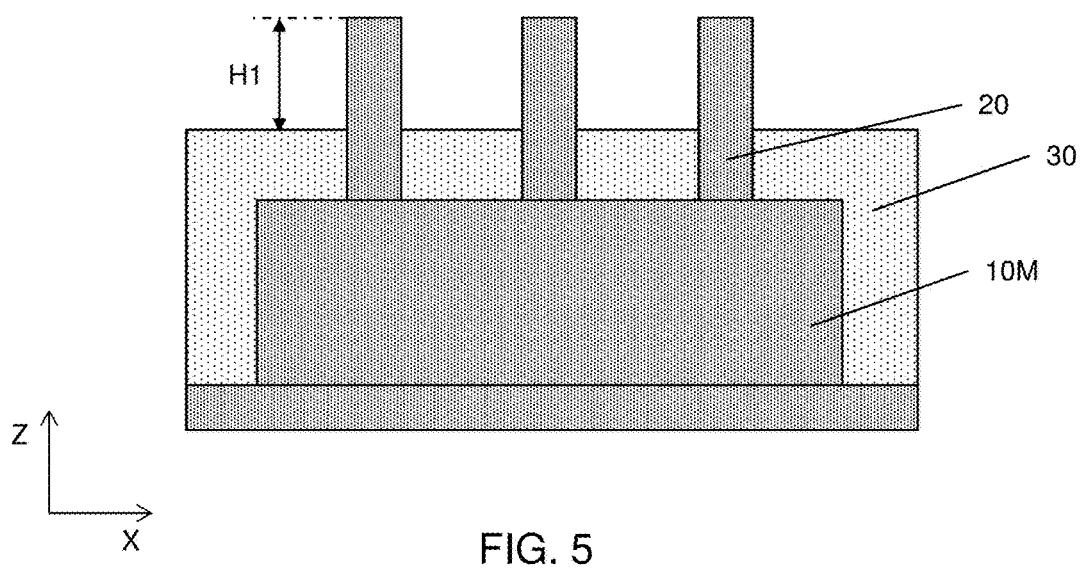

The insulating layer 30 is first formed in a thick layer so that the fin structures are embedded in the thick layer, and the thick layer is recessed so as to expose the upper portions of the fin structures 20, as shown in FIG. 5. The height H1 of the fin structures from the upper surface of the isolation insulating layer 30 is in a range from about 20 nm to about 100 nm in some embodiments, and is in a range from about 30 nm to about 50 nm in other embodiments. After or before recessing the isolation insulating layer 30, a thermal process, for example, an anneal process, may be performed to improve the quality of the isolation insulating layer 30. In certain embodiments, the thermal process is performed by using rapid thermal annealing (RTA) at a temperature in a range from about 900° C. to about 1050° C. for about 1.5 seconds to about 10 seconds in an inert gas ambient, such as an $N_2$, Ar or He ambient.

Figure 6A:
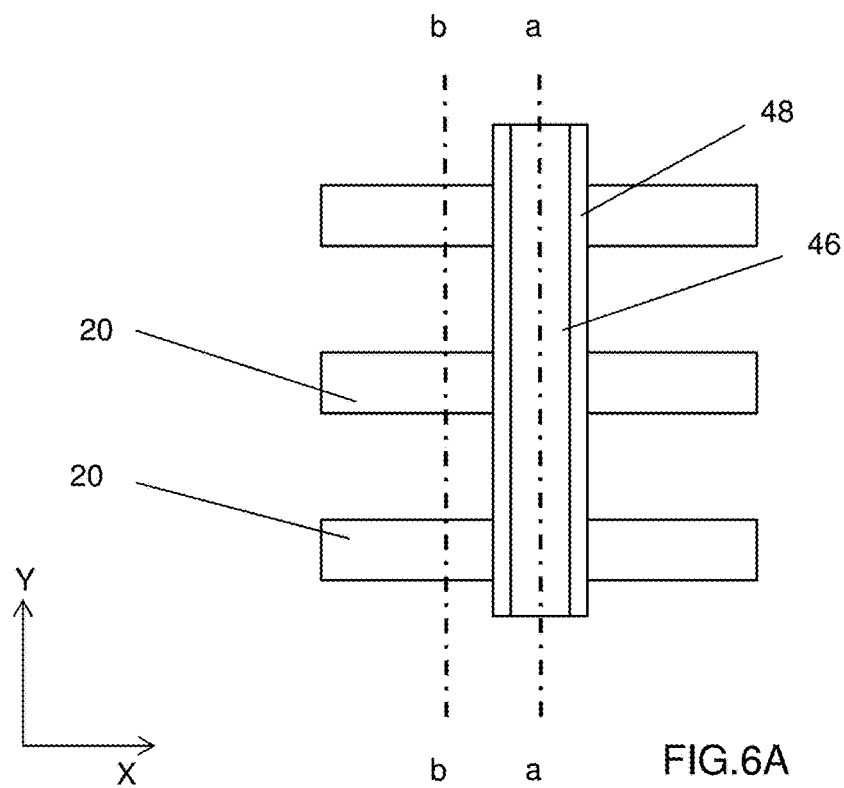
Figure 6B:
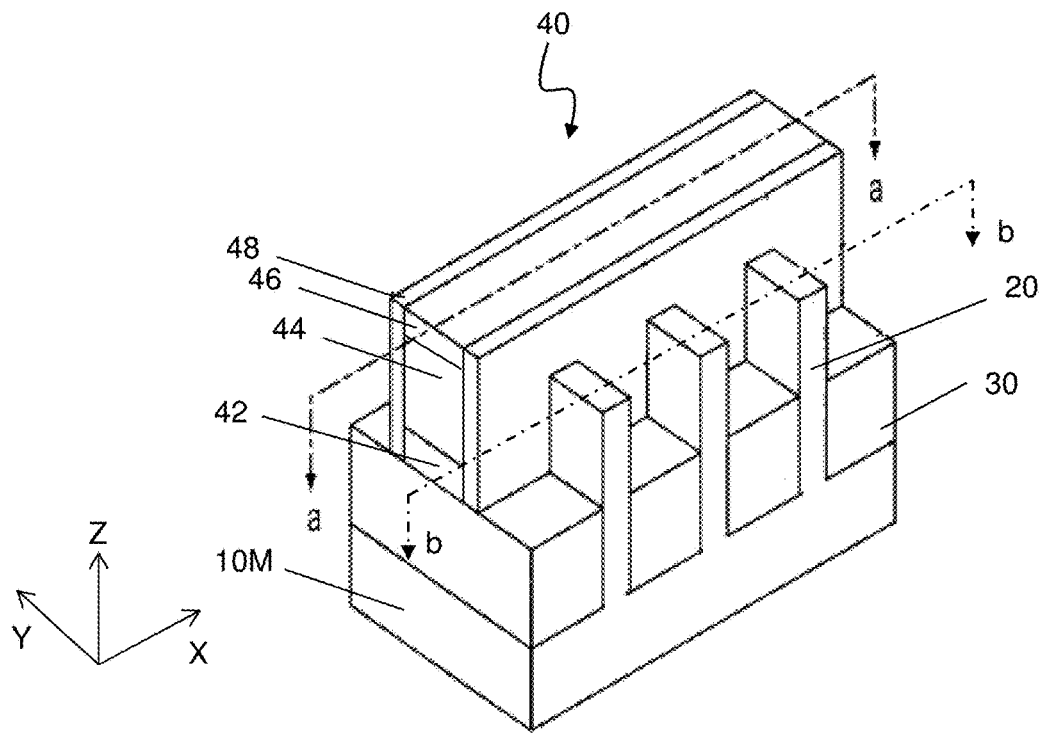
Figure 7A:
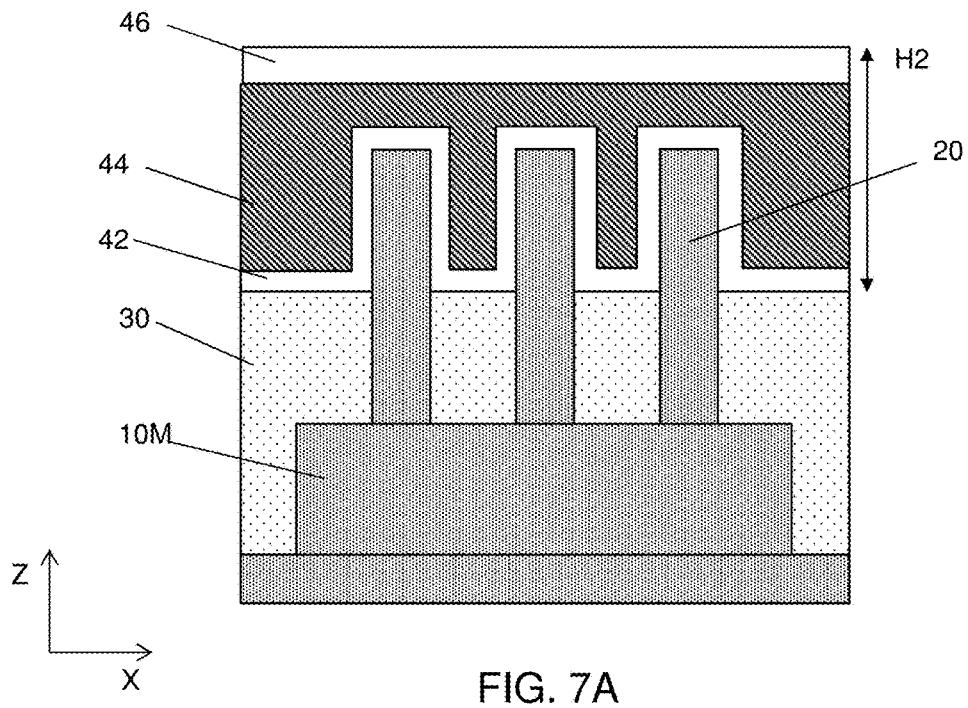
Figure 7B:
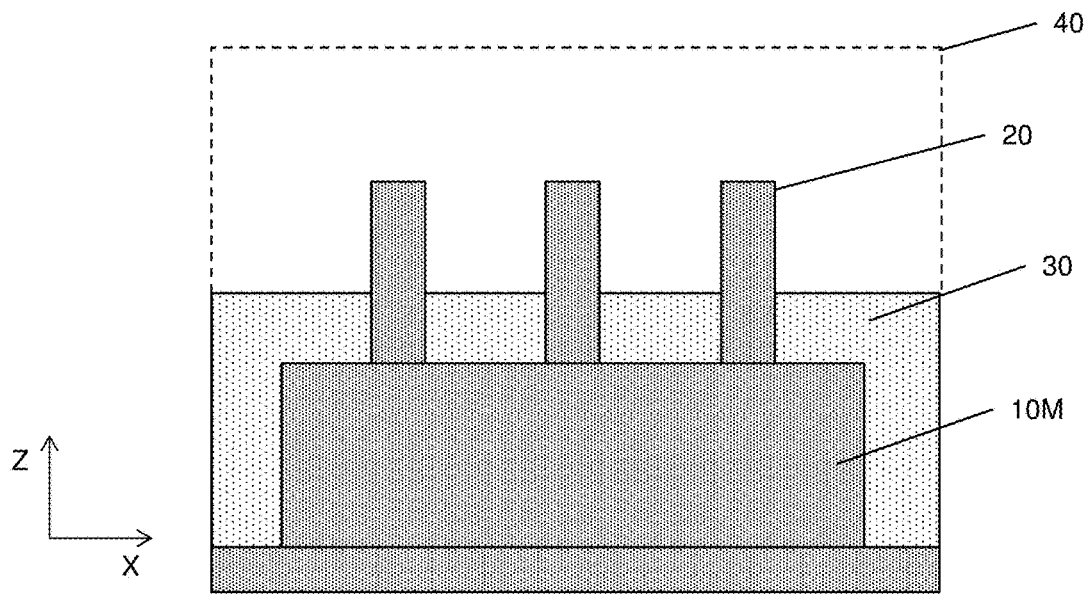

After the insulating layer 30 is formed, a gate structure 40 is formed over the fin structures 20, as shown in FIGS. 6A-6C. FIG. 6A is a plan view (view from the above) and FIG. 6B is an exemplary perspective view. FIG. 7A is an exemplary cross sectional view along line a-a of FIGS. 6A and 6B and FIG. 7B is an exemplary cross sectional view along line b-b of FIGS. 6A and 6B. FIGS. 8-16 are also exemplary cross sectional views corresponding to line b-b of FIGS. 6A and 6B.

As shown in FIGS. 6A and 6B the gate structure 40 extends in the X direction, while the fin structures 20 extend in the Y direction.

To fabricate the gate structure 40, a dielectric layer and a poly silicon layer are formed over the isolation insulating layer 30 and the exposed fin structures 20, and then patterning operations are performed so as to obtain gate structures including a gate pattern 44 made of poly silicon and a dielectric layer 42. In some embodiments, the polysilicon layer is patterned by using a hard mask and the hard mask remains on the gate pattern 44 as a cap insulating layer 46. The hard mask (cap insulating layer 46) includes one or more layers of insulating material. The cap insulating layer 46 includes a silicon nitride layer formed over a silicon oxide layer in some embodiments. In other embodiments, the cap insulating layer 46 includes a silicon oxide layer formed over a silicon nitride layer. The insulating material for the cap insulating layer 46 may be formed by CVD, PVD, ALD, e-beam evaporation, or other suitable process. In some embodiments, the dielectric layer 42 may include one or more layers of silicon oxide, silicon nitride, silicon oxy-nitride, or high-k dielectrics. In some embodiments, a thickness of the dielectric layer 42 is in a range from about 2 nm to about 20 nm, and in a range from about 2 nm to about 10 nm in other embodiments. The height H2 of the gate structures (see, FIG. 7A) is in a range from about 50 nm to about 400 nm in some embodiments, and is in a range from about 100 nm to 200 nm in other embodiments.

In some embodiments, a gate replacement technology is employed. In such a case, the gate pattern 44 and the dielectric layer 42 are a dummy gate electrode and a dummy gate dielectric layer, respectively, which are subsequently removed. If a gate-first technology is employed, the gate pattern 44 and the dielectric layer 42 are used as a gate electrode and a gate dielectric layer.

Further, gate sidewall spacers 48 are formed on both sidewalls of the gate pattern. The sidewall spacers 48 include one or more layers of insulating material, such as $SiO_2$, SiN, SiON, SiOCN or SiCN, which are formed by CVD, PVD, ALD, e-beam evaporation, or other suitable process. A low-k dielectric material may be used as the sidewall spacers. The sidewall spacers 48 are formed by forming a blanket layer of insulating material and performing anisotropic etching. In one embodiment, the sidewall spacer layers are made of silicon nitride based material, such as SiN, SiON, SiOCN or SiCN.

Figure 8:
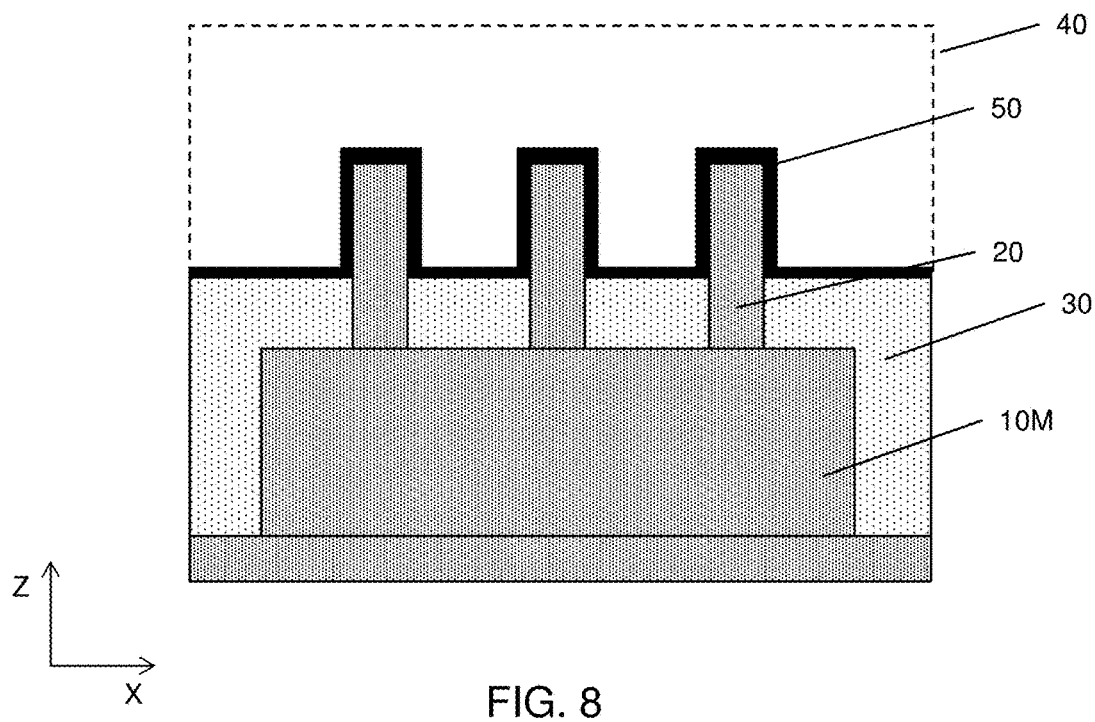

Then, as shown in FIG. 8, a fin mask layer 50 is formed over the fin structures 20. The fin mask layer 50 is made of dielectric material including silicon nitride based material, such as SiN, SiON, SiOCN or SiCN. In one embodiment, SiN is used as the fin mask layer 50. The fin mask layer 50 is formed by CVD, PVD, ALD, e-beam evaporation, or other suitable process. The thickness of the fin mask layer 50 is in a range from about 3 nm to about 10 nm in some embodiments. The variation of the thickness is within about ±2 nm in certain embodiments.

In some embodiments, the fin mask layer 50 and the sidewall spacers 48 for the gate structure are separately formed. In other embodiments, the same blanket layer is used for the fin mask layer 50 and the sidewall spacers 48.

Figure 9:
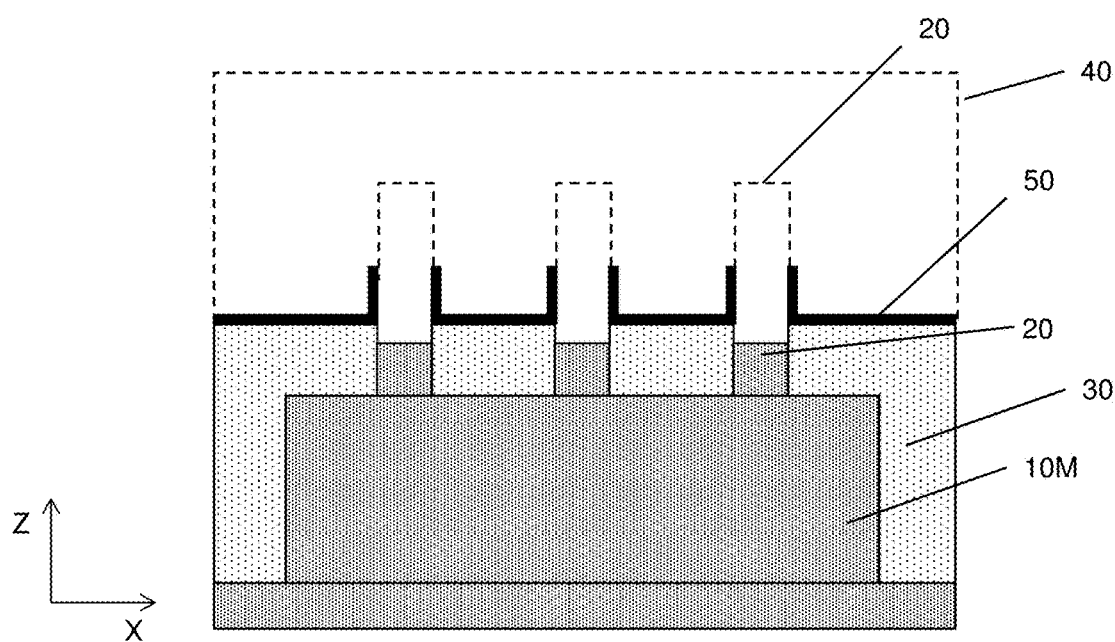

After forming the fin mask layer 50, the upper portion of the fin structures 20 are recessed and a part of the fin mask layer 50 disposed on side surfaces and the top surface of the fin structures protruding from the isolation insulating layer are removed by a dry etching and/or a wet etching operation. The upper portion of the fin structures 20 are recessed (etched) down to the level equal to or below the upper surface of the fin mask layer 50 on the upper surface isolation insulating layer 30, as shown in FIG. 9. By adjusting etching conditions, the fin mask layer 50 remains on the side wall portions of the fin structures and the upper surface of the isolation insulating layer 30, as shown in FIG. 9. The thickness of the remaining fin mask layer 50 is in a range from about 2 nm to about 10 nm in some embodiments.

Figure 10:
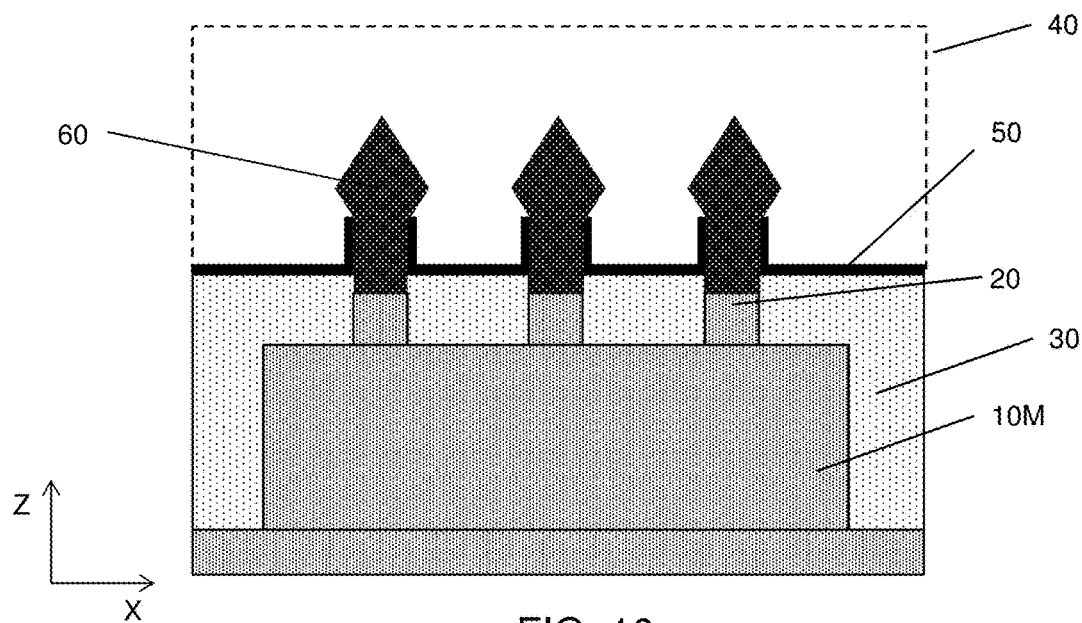

Then, as shown in FIG. 10, an epitaxial source/drain structure 60 is formed over the recessed fin structures 20. The epitaxial source/drain structure 60 is made of one or more layers of semiconductor material having a different lattice constant than the fin structures 20 (channel regions). When the fin structures are made of Si, the epitaxial source/drain structure 60 includes SiP, SiC or SiCP for an n-channel Fin FET and SiGe or Ge for a p-channel Fin FET. The epitaxial source/drain structure 60 is epitaxially formed over the upper portions of the recessed fin structures, and thus has a crystalline structure. Due to the crystal orientation of the substrate formed into the fin structures 20 (e.g., (100) plane), the epitaxial source/drain structure 60 grows laterally and has a diamond-like shape.

The source/drain epitaxial layer 60 may be grown at a temperature of about 600 to 800° C. under a pressure of about 80 to 150 Torr, by using a Si containing gas such as $SiH_4$, $Si_2H_6$ or $SiCl_2H_2$, a Ge containing gas, such as $GeH_4$, $Ge_2H_6$ or $GeCl_2H_2$, a C containing gas, such as $CH_4$ or $C_2H_6$, and/or a dopant gas, such as $PH_3$. The source/drain structure for an n-channel FET and the source/drain structure for a p-channel FET may be formed by separate epitaxial processes.

Figure 11:
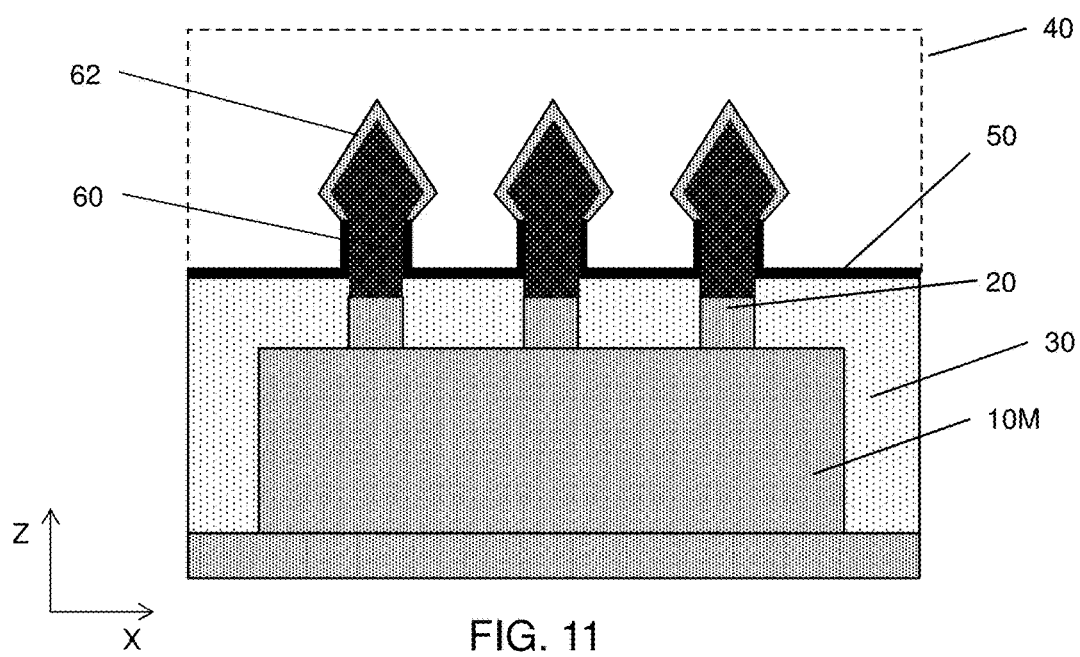

After forming the epitaxial source/drain structure 60, an amorphous first layer 62, such as a-Si layer, is formed over the epitaxial source/drain structure 60, as shown in FIG. 11. In some embodiments, the amorphous layer 62 is selectively formed on the epitaxial source/drain structure 60, and is not formed on the fin mask layer 50 or other insulating layers. In other embodiments, a blanket layer of the amorphous material is formed. The thickness of the first amorphous layer 62 is in a range from about 1 nm to about 10 nm in some embodiments, and is in a range from about 3 nm to about 5 nm in other embodiments.

Figure 12:
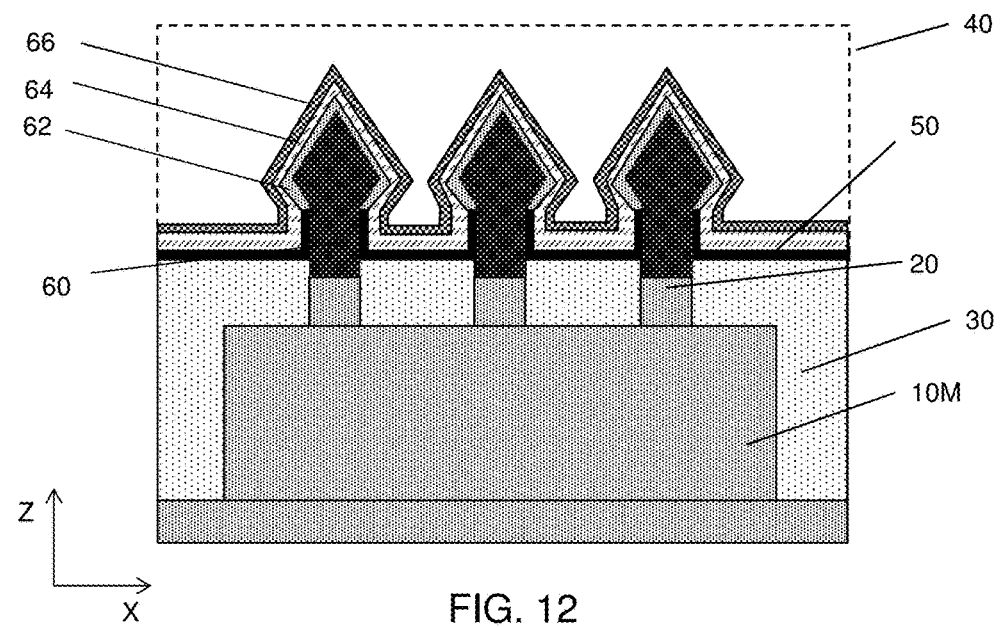

Next, as shown in FIG. 12, a metal second layer 64 is formed over the amorphous layer 62, and subsequently, a third layer 66 is formed over the metal layer 64. The metal material for the second layer 64 is at least one of Ti, Co, Ni, W or Ta. In one embodiment, Ti is used for the second layer 64. The thickness of the second metal layer 64 is in a range from about 1 nm to about 15 nm in some embodiments, and is in a range from about 3 nm to about 10 nm in other embodiments. The third layer 66 is made of a transition metal nitride, such as TiN or TaN. In one embodiment, the third layer 66 is TiN. The thickness of the third layer 66 is in a range from about 1 nm to about 5 nm in some embodiments, and is in a range from about 1 nm to about 3 nm in other embodiments.

Figure 13:
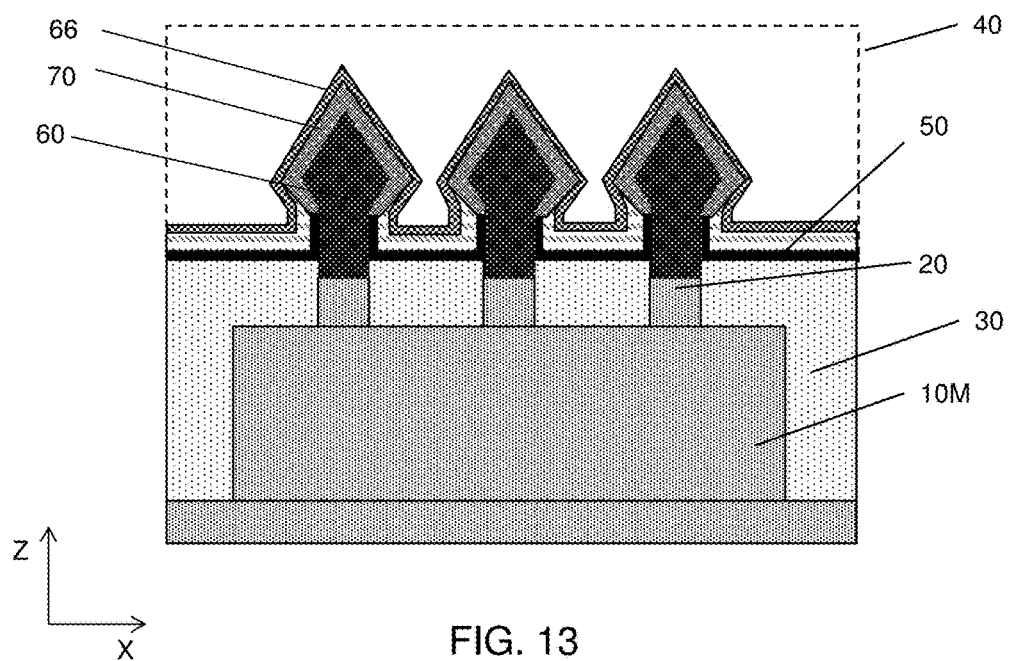

After the second and third layers 64, 66 are formed, a thermal operation (annealing) is performed so as to form an alloy layer 70, as shown in FIG. 13. When the amorphous material is Si, a silicide layer is formed, and when the amorphous material is Ge, a germanide layer is formed. In one embodiment, a TiSi layer 70 is formed by the annealing operation. The thickness of the silicide (alloy) layer 70 is in a range from about 1 nm to about 10 nm in some embodiments, and is in a range from about 3 nm to about 5 nm in other embodiments.

In this embodiment, since the amorphous layer 62 is conformally formed over the epitaxial source/drain structure 60 with a substantially uniform thickness (variation is ±1 nm or less), the silicide layer 70 is also conformally formed over the epitaxial source/drain structure 60 with a substantially uniform thickness (variation is ±1 nm or less).

Figure 14:
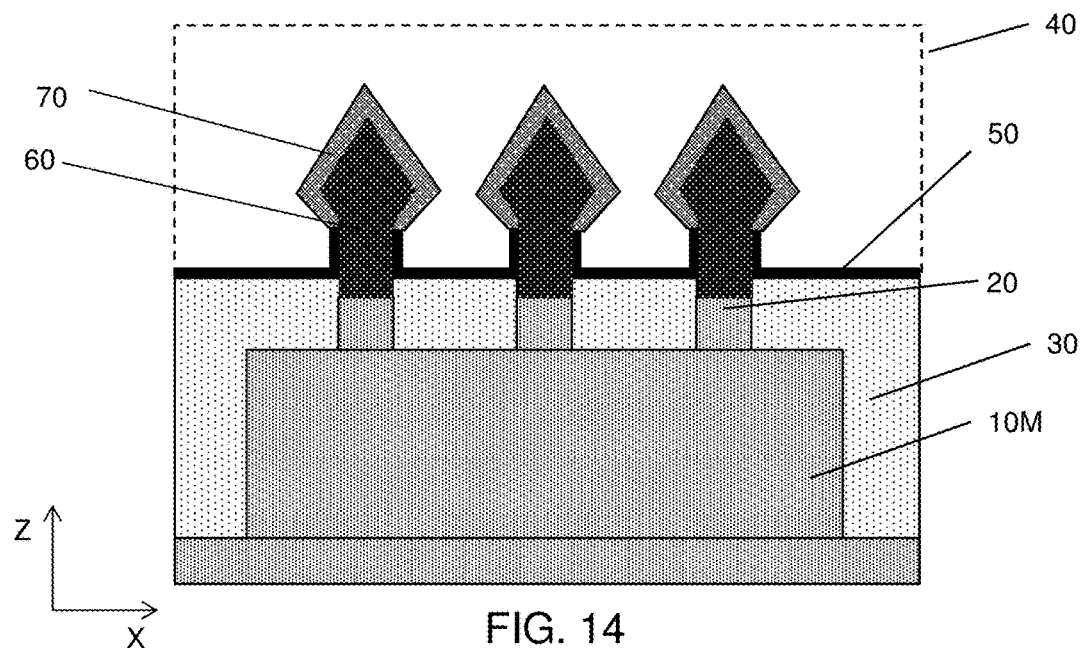

Then, as shown in FIG. 14, the third layer 66 and the second layer, if remaining, are selectively removed by a wet and/or a dry etching process, leaving the silicide layer 70.

Figure 15:
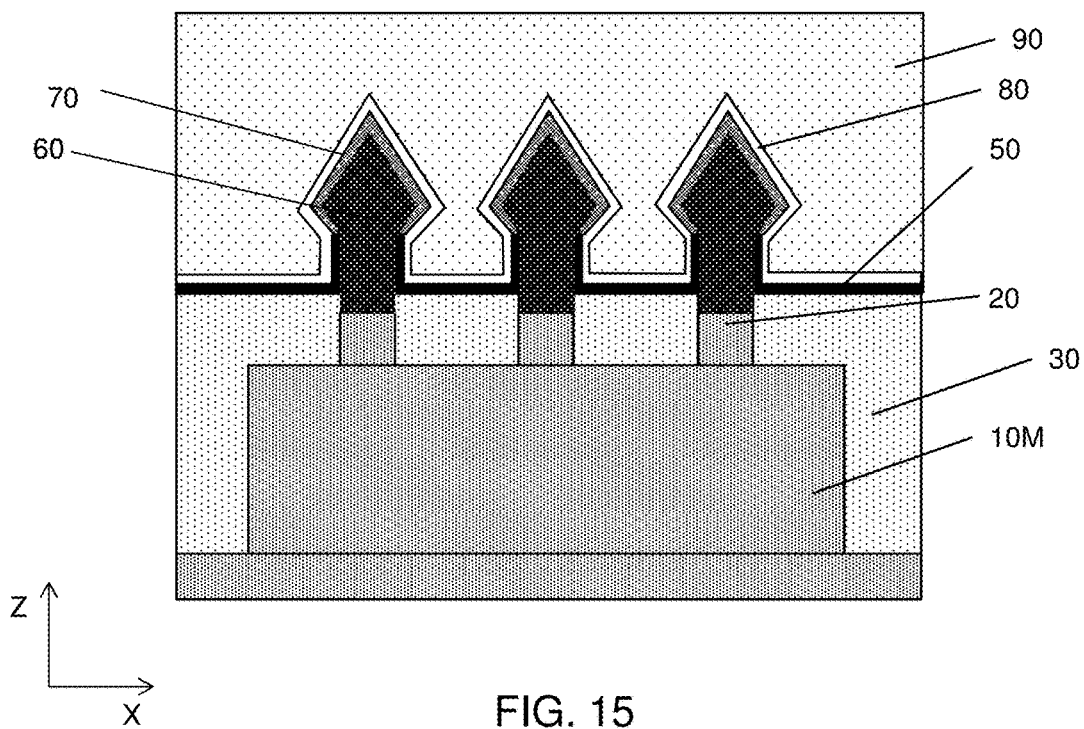
Figure 16:
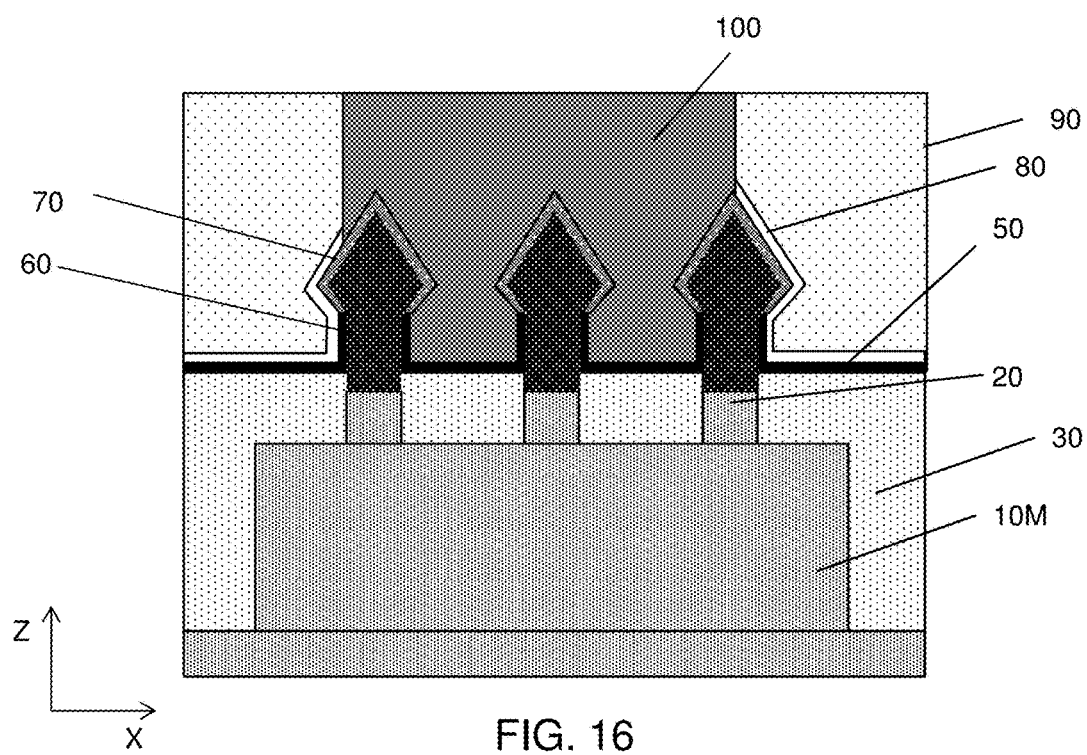
Figure 17:
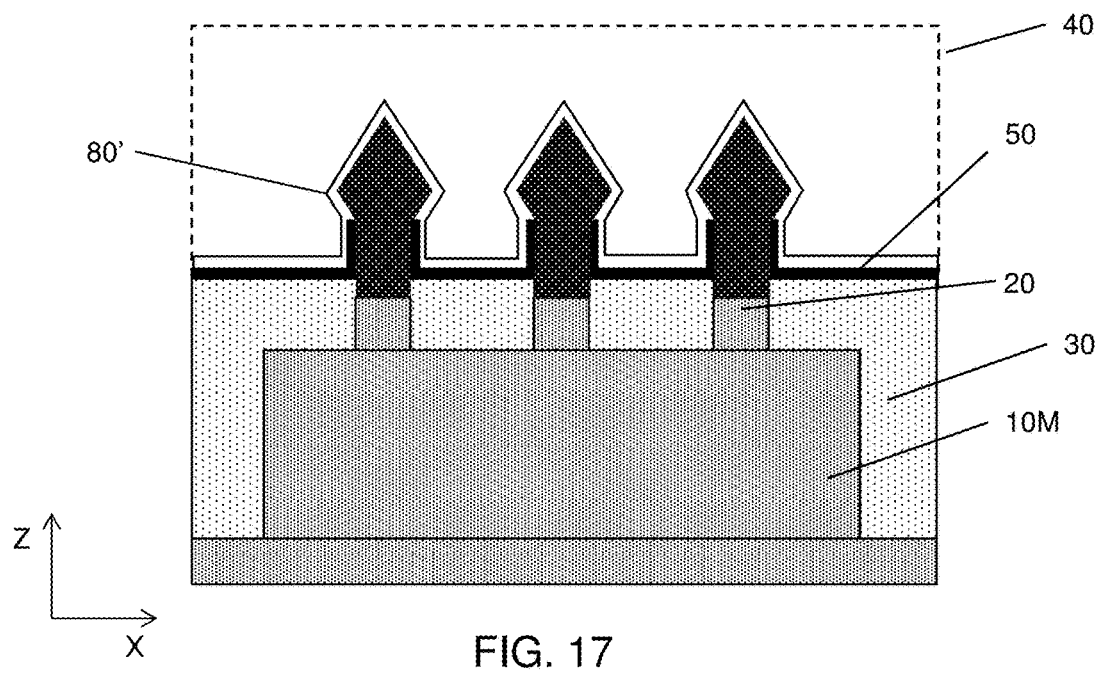
FIGS. 17-23 show exemplary cross sectional views of various stages for manufacturing a Fin FET device according to another embodiment of the present disclosure.

Next, as shown in FIG. 15, an insulating layer 80, which functions as an etching stop layer in subsequent contact etching, and a first interlayer dielectric (ILD) layer 90 is formed.

The insulating layer 80 includes one or more layers of insulating material, such as SiN, SiON, SiOCN or SiCN. In one embodiment, SiN is used as the first insulating layer 80. The first ILD layer 90 includes one or more layers of insulating material, such as $SiO_2$, SiON or SiOC, or a low-k dielectric material. In one embodiment, $SiO_2$ is used as the first ILD layer 90.

Then, by using a lithography operation and an etching operation, a contact hole is formed in the insulating layer 80 and the first ILD layer 90, and the contact hole is filled with a conductive material, thereby forming a contact plug 100. The contact plug 100 may include a single layer or multiple layers of any suitable metal such as Co, W, Ti, Ta, Cu, Al and/or Ni and/or nitride thereof.

In some embodiments, a metal gate structure (not shown) is formed by a gate replacement technology. After forming the silicide layer 70, and before forming the contact hole, the dummy gate structures (dummy gate electrode 44 and dummy gate dielectric layer 42) are removed and replaced with a metal gate structures (metal gate electrode and gate dielectric layer).

A dielectric layer is formed over the dummy gate structures and a planarization operation, such as a chemical mechanical polishing (CMP) process or an etch-back process, is performed to expose the upper surface of the dummy gate electrode 44. Then, the dummy gate electrode 44 and the dummy gate dielectric layer 42 are removed, by appropriate etching processes, respectively, to form a gate opening. Metal gate structures including a gate dielectric layer and metal gate electrode are formed in the gate openings.

The gate dielectric layer may be formed over an interface layer (not shown) disposed over the channel layer of the fin structures 20. The interface layer may include silicon oxide or germanium oxide with a thickness of 0.2 nm to 1.5 nm in some embodiments. In other embodiments, the thickness of the interface layer is in a range about 0.5 nm to about 1.0 nm.

The gate dielectric layer includes one or more layers of dielectric materials, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. The gate dielectric layer is formed by, for example, chemical vapor deposition (CVD), physical vapor deposition (PVD), atomic layer deposition (ALD), high density plasma CVD (HDPCVD), or other suitable methods, and/or combinations thereof. The thickness of the gate dielectric layer is in a range from about 1 nm to about 10 nm in some embodiments, and may be in a range from about 2 nm to about 7 nm in other embodiments.

The metal gate electrode is formed over the gate dielectric layer. The metal gate electrode includes one or more layers of any suitable metal material, such as aluminum, copper, titanium, tantalum, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

In certain embodiments of the present disclosure, one or more work function adjustment layers (not shown) may be interposed between the gate dielectric layer and the metal gate electrode. The work function adjustment layer is made of a conductive material such as a single layer of TiN, TaN, TaAlC, TiC, TaC, Co, Al, TiAl, HfTi, TiSi, TaSi or TiAlC, or a multilayer of two or more of these materials. For the n-channel Fin FET, one or more of TaN, TaAlC, TiN, TiC, Co, TiAl, HfTi, TiSi and TaSi is used as the work function adjustment layer, and for the p-channel Fin FET, one or more of TiAlC, Al, TiAl, TaN, TaAlC, TiN, TiC and Co is used as the work function adjustment layer.

After depositing appropriate materials for the metal gate structures, planarization operations, such as CMP, are performed.

After forming the contact plug 100, further CMOS processes are performed to form various features such as additional interlayer dielectric layer, contacts/vias, interconnect metal layers, and passivation layers, etc.

FIGS. 17-23 show exemplary cross sectional views of various stages for manufacturing a Fin FET device according to another embodiment of the present disclosure. It is understood that additional operations can be provided before, during, and after processes shown by FIGS. 17-23, and some of the operations described below can be replaced or eliminated, for additional embodiments of the method. The order of the operations/processes may be interchangeable. Further, the configurations, structures, operations and/or materials used for FIGS. 1A-1D and FIGS. 2-16 may be applied to the manufacturing processes shown by FIGS. 17-23, and the detailed description may be omitted.

In this embodiment, the silicide layer is formed after the contact hole is opened.

After the source/drain structure 60 is formed as shown in FIG. 10, an insulating layer 80', similar to the insulating layer 80, which functions as an etching stop layer in the subsequent contact etching, is formed.

Figure 18:
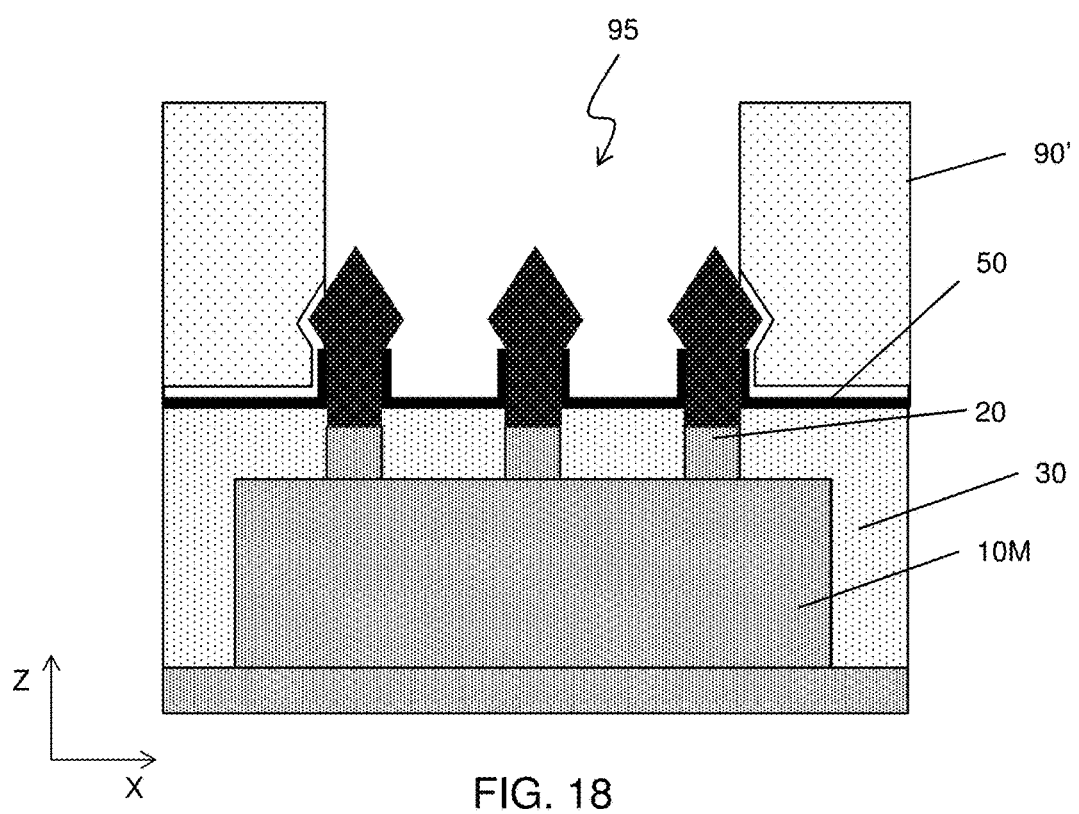

Then, a first ILD layer 90', similar to the first ILD layer 90, is formed. Then, by using a lithography operation and an etching operation, a contact hole 95 is formed in the insulating layer 80' and the first ILD layer 90', as shown in FIG. 18.

Figure 19:
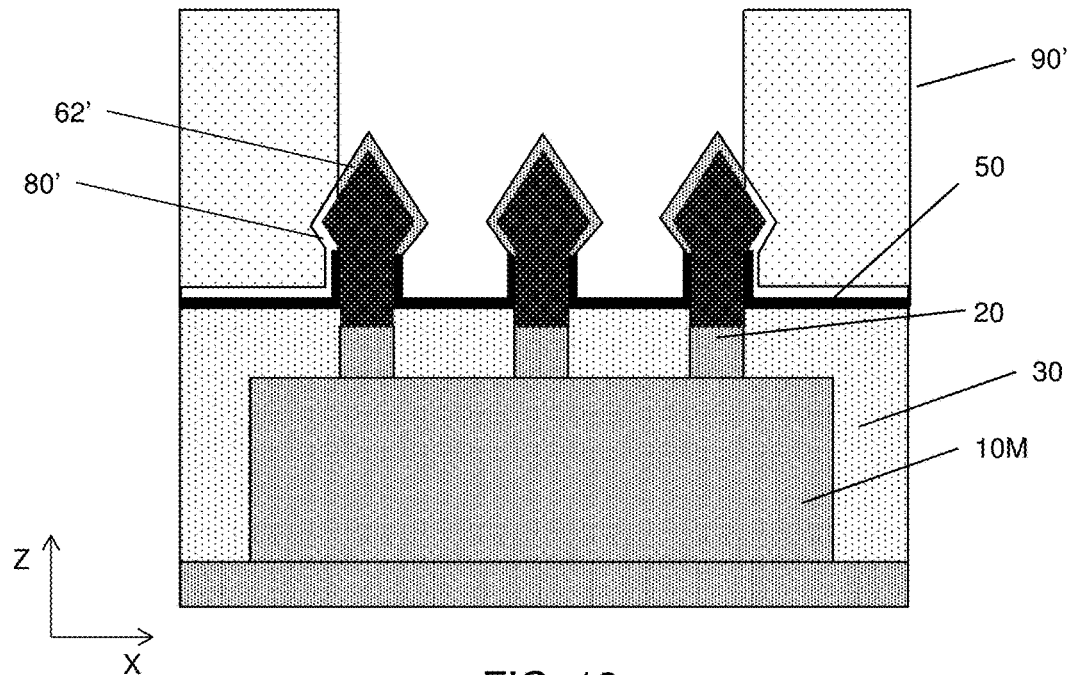

Then, as shown in FIG. 19, an amorphous first layer 62', such as a-Si layer, is formed over the epitaxial source/drain structure 60, similar to FIG. 11. As shown in FIG. 19, the amorphous layer 62' is selectively formed on the epitaxial source/drain structure 60.

Figure 20:
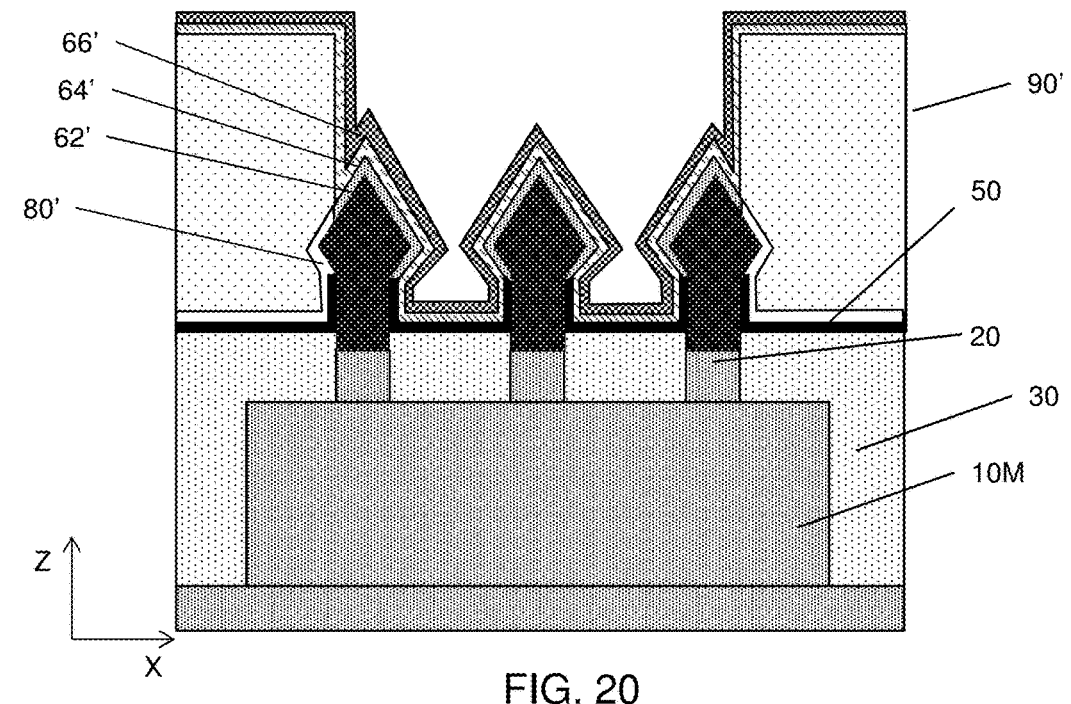

Similar to FIG. 12, a metal second layer 64' is formed over the amorphous layer 62', and subsequently, a third layer 66' is formed over the metal layer 64', as shown in FIG. 20.

Figure 21:
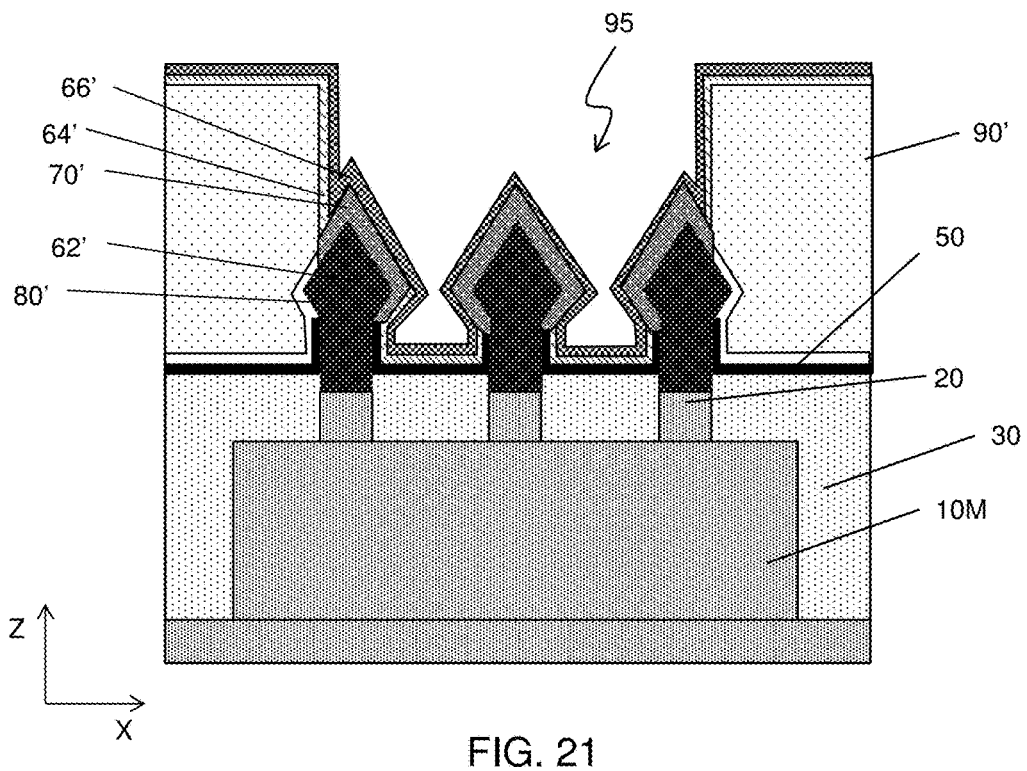

After the second and third layers 64', 66' are formed, a thermal process is performed so as to form a silicide layer (an alloy layer) 70', as shown in FIG. 21, similar to FIG. 13.

Figure 22:
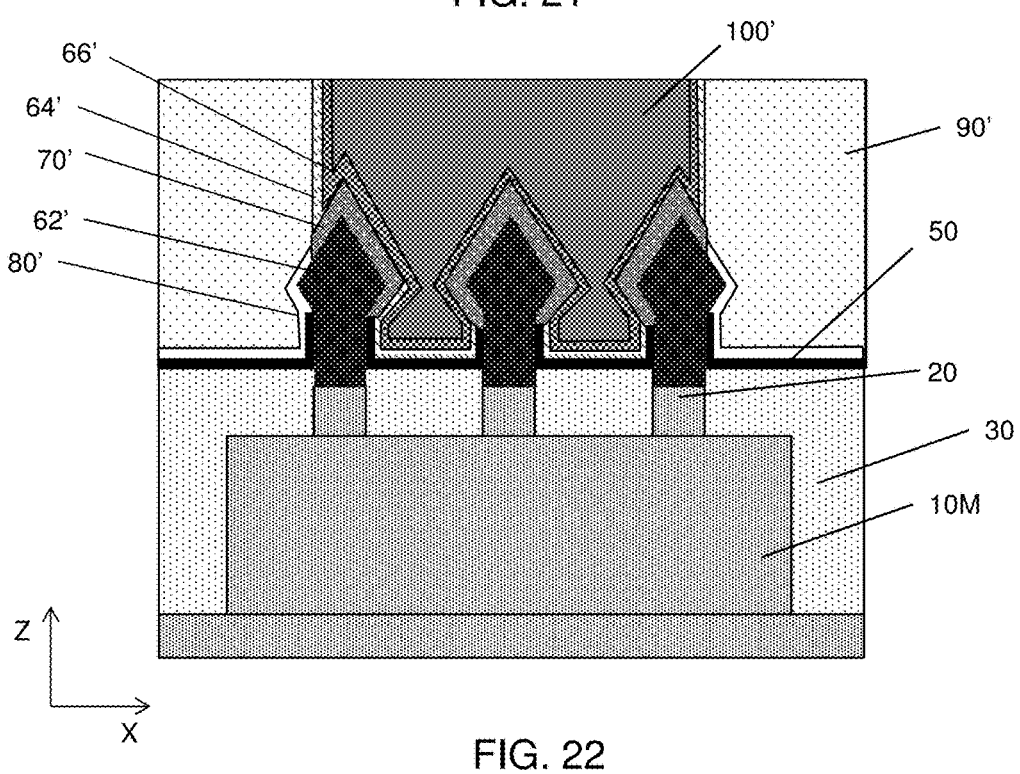
Figure 23:
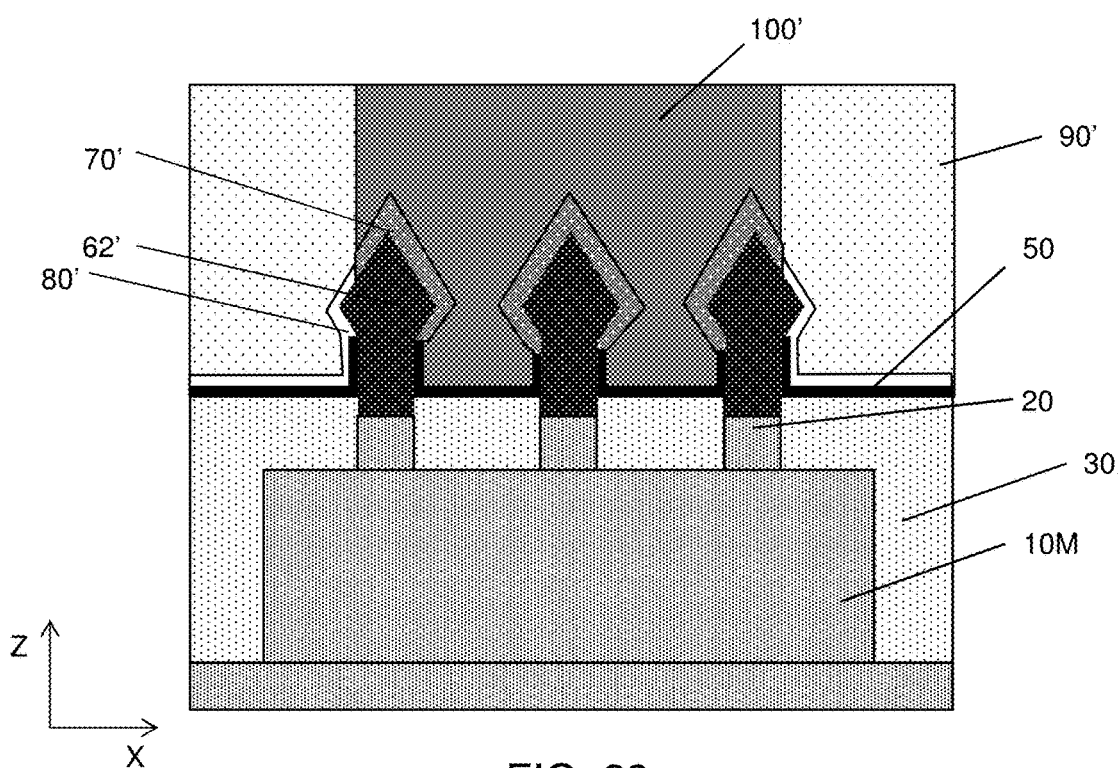

Then, as shown in FIG. 22, a conductive material is formed in the contact hole 95, so as to form a contact plug 100'. Since the contact plug 100' is formed by using a CMP process, the second and third layers 64', 66' formed over the ILD layer 90' are also removed. In this embodiment, the second and third layers 64' and 66' within the contact hole 95 are not removed after the formation of the silicide layer 70'. If the second and third layers 64' and 66' are removed after forming the silicide layer 70', the resultant structure is shown in FIG. 23.

After forming the contact plug 100', further CMOS processes are performed to form various features such as additional interlayer dielectric layer, contacts/vias, interconnect metal layers, and passivation layers, etc.

In the present disclosure, since an amorphous layer is formed between the semiconductor layer and a metal layer when forming an alloy layer (e.g., a silicide layer), it is possible to fabricate a thin alloy layer and to precisely control the thickness of the alloy layer. Further, it is possible to obtain a smooth interface between the alloy layer and the underlying semiconductor layer. With such an alloy layer, it is further possible to reduce a contact resistance to the alloy layer.

It will be understood that not all advantages have been necessarily discussed herein, no particular advantage is required for all embodiments or examples, and other embodiments or examples may offer different advantages.

In accordance with one aspect of the present disclosure, in a method of manufacturing a semiconductor device, a first layer containing an amorphous first material is deposited over a semiconductor layer. A second layer containing a metal second material is formed over the first layer. A thermal process is performed to form an alloy layer of the amorphous first material and the metal second material.

In accordance with another aspect of the present disclosure, in a method of manufacturing a semiconductor device including a Fin FET, a fin structure is formed over a substrate, the fin structure extending in a first direction in plan view. An isolation insulating layer is formed over the substrate so that a lower portion of the fin structure is embedded in the isolation insulating layer and an upper portion of the fin structure is exposed from the isolation insulating layer. An upper portion of the fin structure is recessed. An epitaxial source/drain structure is formed over the recessed fin structure. A silicide layer is formed over at least a part of the epitaxial source/drain structure. The forming the silicide layer includes the following operations. An amorphous silicon layer is formed over the epitaxial source/drain structure by a deposition process. A Ti layer is formed over the amorphous silicon layer. A TiN layer is formed over the Ti layer. A thermal process is performed to form a TiSi layer.

In accordance with another aspect of the present disclosure, a semiconductor device includes an isolation insulating layer disposed over a substrate, and a fin structure disposed over the substrate and extending in a first direction in plan view. An upper portion of the fin structure is exposed from the isolation insulating layer. The semiconductor device further includes a gate structure disposed over parts of the fin structure. The gate structure extends in a second direction crossing the first direction. The semiconductor device further includes a source/drain structure formed on the upper portion of the fin structures, which are not covered by the gate structure and exposed from the isolation insulating layer. An upper portion of the source/drain structure includes a silicide layer. The silicide layer has a substantially uniform thickness in a range from 1 nm to 10 nm.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
    forming a first layer containing an amorphous first material by a deposition process directly on a semiconductor layer;
    forming a second layer containing a metal second material over the first layer;
    forming a third layer containing a third material over the second layer;
    performing a thermal process, thereby forming an alloy layer of the amorphous first material and the metal second material, the alloy layer being in direct contact with the third layer; and
    after performing the thermal process, removing the third layer, thereby exposing a major surface of the alloy layer, and
    after removing the third layer, forming an insulating layer in direct contact with the major surface of the alloy layer.
2. The method of claim 1, wherein the amorphous first material is amorphous silicon or amorphous germanium.
3. The method of claim 1, wherein:
    the amorphous first material is amorphous silicon, and
    the metal second material is at least one of Ti, Co, Ni, W or Ta.
4. The method of claim 1, wherein the third material is a metal nitride.
5. The method of claim 1, wherein:
    the amorphous first material is amorphous silicon,
    the metal second material is Ti, and
    the third material is TiN.

6. The method of claim 1, wherein the thermal process is performed at a temperature of 500° C. to 1000° C.
7. The method of claim 1, wherein the thermal process is performed for a time period of 1 μsec to 1 msec.
8. The method of claim 1, wherein a thickness of the first layer is in a range from 1 nm to 10 nm.
9. The method of claim 1, wherein the alloy layer has a substantially uniform thickness in a range from 1 nm to 10 nm.
10. The method of claim 1, wherein by the thermal process, the amorphous first material is fully consumed forming the alloy layer.
11. The method of claim 1, further comprising a cleaning process before forming the second layer.
12. A method of manufacturing a semiconductor device including a Fin FET, the method comprising:
    forming a fin structure over a substrate, the fin structure extending in a first direction in plan view,
    forming an isolation insulating layer over the substrate so that a lower portion of the fin structure is embedded in the isolation insulating layer and an upper portion of the fin structure is exposed from the isolation insulating layer;
    recessing an upper portion of the fin structure;
    forming an epitaxial source/drain structure over the recessed fin structure;
    forming a silicide layer over at least a part of the epitaxial source/drain structure, wherein:
    the forming the silicide layer includes:
        forming an amorphous silicon layer over the epitaxial source/drain structure by a deposition process;
        forming a Ti layer over the amorphous silicon layer;
        forming a TiN layer over the Ti layer; and
        performing a thermal process, thereby forming a TiSi layer,
        removing at least the TiN layer after the TiSi layer is formed and before forming a first interlayer dielectric layer, and
        after removing the TiN layer, forming an etch stop layer in direct contact with a surface of the TiSi layer, from which the TiN layer is removed.
13. The method of claim 12, further comprising:
    before recessing the fin structure, forming a dummy gate structure over a part of the fin structure, the dummy gate structure including a dummy gate electrode and a dummy gate dielectric layer disposed between the dummy gate electrode and the upper portion of the fin structure, the dummy gate structure extending in a second direction crossing the first direction in plan view;
    after forming the silicide layer, forming the first interlayer dielectric layer;
    after forming the first interlayer dielectric layer, removing the dummy gate structure, thereby forming a gate space in the interlayer dielectric layer;
    forming a metal gate structure in the gate space;
    forming a second interlayer dielectric layer over the metal gate structure; and
    forming a contact plug in contact with the silicide layer of the epitaxial source/drain structure.
14. The method of claim 12, wherein:
    the epitaxial source/drain structure is formed to have a diamond shape over the recessed fin structure.
15. The method of claim 14, wherein:
    the silicide layer is formed to contact at least a top part and a partial bottom part of the epitaxial source/drain structure.

16. The method of claim 1, wherein:
the remaining metal second material is completely removed when the third layer is completely removed.

17. A method of manufacturing a semiconductor device, the method comprising:
forming a first layer containing an amorphous first material by a deposition process directly on a semiconductor layer over a substrate;
forming a second layer containing a metal second material over the first layer;
forming a third layer containing a third material made of metal nitride over the second layer;
performing a thermal process, thereby forming an alloy layer of the amorphous first material and the metal second material, the alloy layer being in direct contact with the third layer; and
after performing the thermal process, removing the third layer, thereby exposing a major surface of the alloy layer, and
after removing the third layer, forming an insulating layer in direct contact with the major surface of the alloy layer.

18. The method of claim 17, wherein:
the amorphous first material is amorphous silicon,
the metal second material is Ti, and
the third material is TiN.

* * * * *